(12) United States Patent
Yang et al.

(10) Patent No.: US 11,901,694 B2
(45) Date of Patent: Feb. 13, 2024

(54) PACKAGE STRUCTURE

(71) Applicant: iReach Corporation, Hsinchu County (TW)

(72) Inventors: Hsiu-Ju Yang, Hsinchu (TW); Shou-Lung Chen, Hsinchu (TW); Hsin-Chan Chung, Hsinchu (TW)

(73) Assignee: iReach Corporation, Hsinchu County (TW)

( * ) Notice: Subject to any disclaimer, the term of this patent is extended or adjusted under 35 U.S.C. 154(b) by 0 days.

(21) Appl. No.: 17/190,186

(22) Filed: Mar. 2, 2021

(65) Prior Publication Data

US 2021/0273403 A1    Sep. 2, 2021

(30) Foreign Application Priority Data

Mar. 2, 2020    (TW) .................................. 109106722

(51) Int. Cl.
| | |
|---|---|
| *H01S 5/042* | (2006.01) |
| *H01L 33/48* | (2010.01) |
| *H01L 33/54* | (2010.01) |
| *H01L 33/62* | (2010.01) |
| *H01S 5/02257* | (2021.01) |
| *H01L 33/58* | (2010.01) |
| *H01S 5/02208* | (2021.01) |
| *H01S 5/02234* | (2021.01) |
| *H01S 5/068* | (2006.01) |
| *H01S 5/183* | (2006.01) |
| *H01S 5/00* | (2006.01) |

(52) U.S. Cl.
CPC ............ *H01S 5/042* (2013.01); *H01L 33/486* (2013.01); *H01L 33/54* (2013.01); *H01L 33/62* (2013.01); *H01S 5/0014* (2013.01); *H01S 5/02257* (2021.01); *H01L 33/58* (2013.01); *H01L 2933/005* (2013.01)

(58) Field of Classification Search
CPC ....... H01L 33/486; H01L 33/58; H01L 33/54; H01L 33/62; H01S 5/042; H01S 5/02257; H01S 5/183; H01S 5/06825; H01S 5/0183

See application file for complete search history.

(56) References Cited

U.S. PATENT DOCUMENTS

| | | | |
|---|---|---|---|
| 2005/0013562 A1* | 1/2005 | Tatehata ............ | H01L 31/02325 385/93 |
| 2013/0049044 A1* | 2/2013 | Lee ........................ | H01L 33/642 257/E33.072 |
| 2015/0263239 A1* | 9/2015 | Watanabe ............... | H01L 33/62 362/293 |
| 2017/0194538 A1* | 7/2017 | Chen ........................ | H01L 33/56 |
| 2018/0233643 A1* | 8/2018 | Wu ........................ | H01L 33/483 |

(Continued)

FOREIGN PATENT DOCUMENTS

WO    WO-2018174539 A1 *  9/2018    ............. H01L 33/36

*Primary Examiner* — Antonio B Crite
(74) *Attorney, Agent, or Firm* — DITTHAVONG, STEINER & MLOTKOWSKI

(57) ABSTRACT

A package structure includes: a substrate includes a first surface; a semiconductor chip disposed on the first surface; a support disposed on the first surface and surrounding the semiconductor chip comprises an electrical conducting member and penetrating the support; and an optical component disposed on the support and electrically connected to the substrate by the electrical conducting member.

7 Claims, 15 Drawing Sheets

(56) References Cited

U.S. PATENT DOCUMENTS

2020/0227597 A1\* 7/2020 Chu ........................ H01L 33/62
2020/0313052 A1\* 10/2020 Lin ....................... H01L 33/486
2021/0013375 A1\* 1/2021 Wu ......................... H01L 33/62

\* cited by examiner

PACKAGE STRUCTURE

TECHNICAL FIELD

The present disclosure relates to package structures and, more particularly, to a vertical cavity surface emitting laser (VCSEL) component package structure.

DESCRIPTION OF THE PRIOR ART

Referring to FIG. 1, a conventional laser chip 110, such as a vertical cavity surface emitting laser (VCSEL) component, is attached to a ceramic substrate 100 and then undergoes wire bonding to form a wire 120. After that, a spacer 130 is positioned to surround the laser chip 110, thereby a space 140 is formed. The space 140 serves as an air layer. Then, an optical component 150 is disposed on top of the spacer 130 and top of the space 140, thereby finishing the single chip packaging process to form a package structure 10, which is subsequently connected to an external circuit board. The optical component 150 includes a micro lens array (MLA) or a diffraction optical element (DOE) whereby a laser beam emitted from the laser chip 110 is converted to a uniform surface light source, array dots light source or irregularly scattered dots light source.

Referring to FIG. 2, in order to further consider a protective function, such as eye-safety protective function, in a laser chip in the applicable module, a package structure 20 includes a photodiode 220 and wires 210, 215. The wires 210, 215 are respectively connected to the laser chip 110 and the photodiode 220 by wire bonding. When a laser beam emitted from the laser chip 110 passes through the optical component 150 above the laser chip 110, the laser beam is converted into a uniform surface light source, array dots light source or scattered dots light source and shine on an external object. After that, the light reflected by the external object is absorbed by the photodiode 220. Therefore, the condition of the optical component 150 can be monitored. For example, if the optical component 150 is damaged or deteriorated, the angle of the reflecting light changes, thereby preventing the photodiode 220 from receiving the reflecting light. Thus, it is determined that the optical component 150 is broken, and thus the laser chip 110 can be turned off in order to protect eyes from harming by the laser beam.

SUMMARY OF THE DISCLOSURE

The present disclosure provides a package structure, which is a chip scale package (CSP) structure produced by a wafer level package (WLP) manufacturing process, with a view to augmenting the production yield of package structure and downsizing the package structure.

The present disclosure provides a package structure, which includes electrical conducting support and provides a novel protective function to a semiconductor chip in the module. Therefore, the volume of the module can be reduced and the risk of modular failure caused by an external circuit break can be greatly decreased. Besides, the manufacturing cost of the module can be further reduced.

The present disclosure provides a package structure includes a substrate including a first surface, a semiconductor chip disposed on the first surface, a spacer disposed on the first surface and surrounding the semiconductor chip and includes an electrical conducting member penetrating the support; and an optical component disposed on the support and electrically connected to the substrate by the electrical conducting member.

The present disclosure provides a package structure, comprising: a semiconductor chip including a first surface, a second surface opposing to the first surface, a side surface between the first surface and the second surface, a first conducting structure and a second conducting structure, the first and second conducting structures on the first surface of the semiconductor chip; a glue layer surrounding the side surface of the semiconductor chip; a spacer disposed on the glue layer and surrounding the semiconductor chip; and an optical component disposed on the spacer and facing the second surface of the semiconductor chip.

BRIEF DESCRIPTION OF THE DRAWINGS

Technical features of the present disclosure are illustrated by embodiments, depicted by accompanying drawings, and described below. However, the detailed descriptions and the accompanying drawings are illustrative rather than restrict to the present disclosure.

DETAILED DESCRIPTION OF THE EMBODIMENTS

Figure 1:
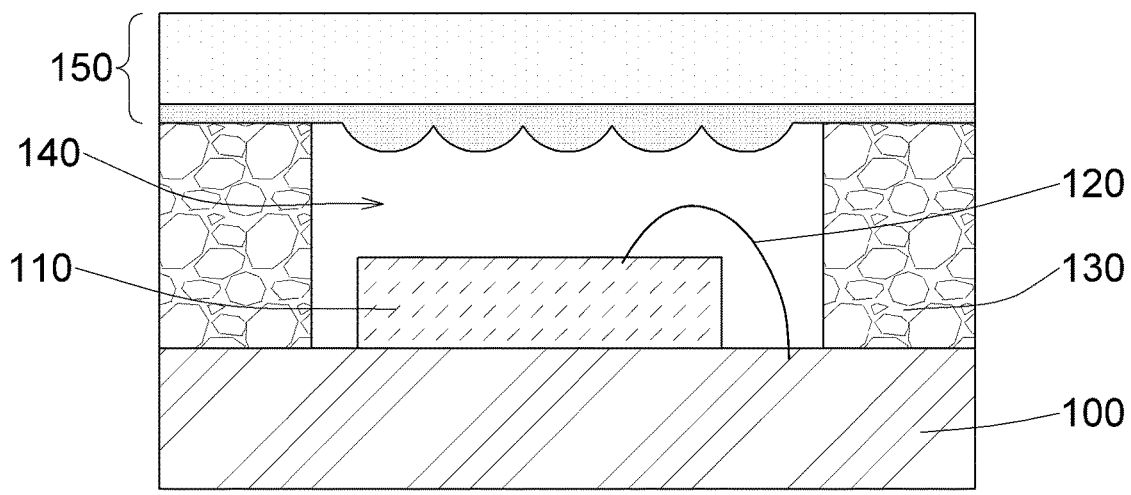
FIG. 1 is a schematic cross-sectional view of a conventional package structure.
Figure 2:
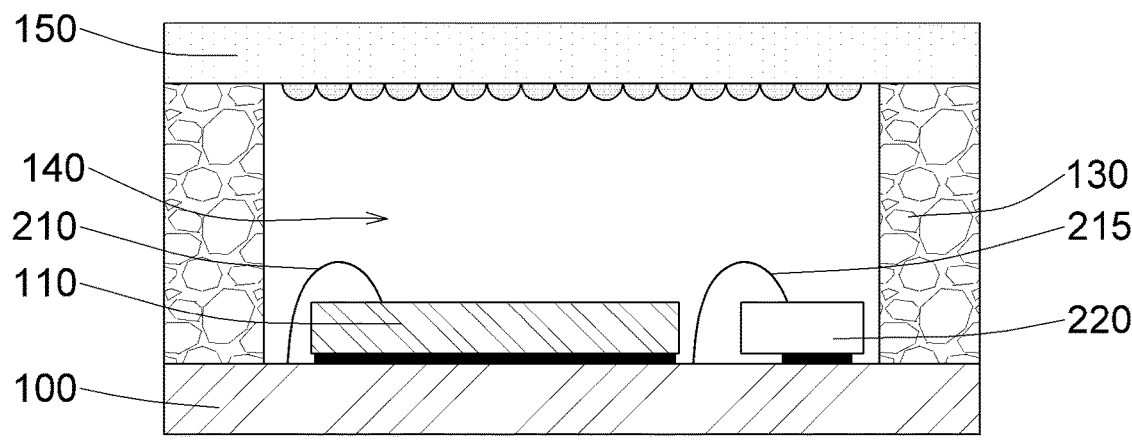
FIG. 2 is a schematic cross-sectional view of a conventional package structure which comes with a protection mechanism.

Concepts embodied in the present disclosure are illustrated by embodiments, depicted by drawings, and described below. Identical reference numerals used in the embodiments and the accompanying drawings and the descriptions denote identical or similar components. For the sake of illustration, the accompanying drawings are not drawn to scale.

Figure 3:
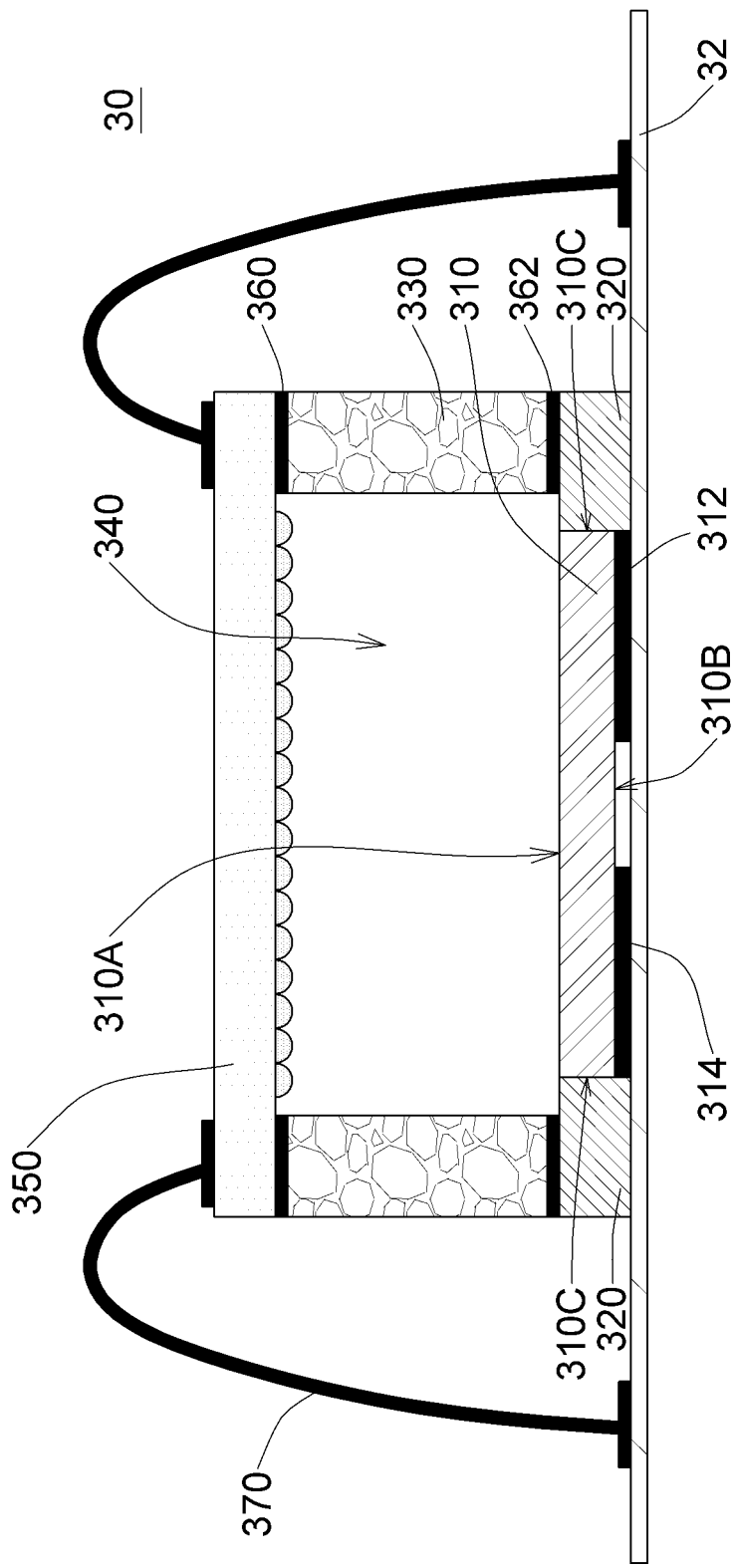
FIG. 3 is a schematic cross-sectional view of a package structure according to an embodiment of the present disclosure.

Referring to FIG. 3, there is a schematic cross-sectional view of a package structure according to a first embodiment of the present disclosure. In this embodiment, a package structure 30 is produced by a wafer level package manufacturing process and includes a semiconductor chip 310 for emitting a laser beam. The semiconductor chip 310 includes a first surface 310A, a second surface 310B opposing to the first surface 310A, a side surface 310C between the first surface 310A and the second surface 310B, a first conducting structure 312 and a second conducting structure 314 which are disposed on a second surface 310B. The side surface 310C of the semiconductor chip 310 is surrounded by a glue layer 320. A spacer 330 is disposed on the glue layer 320 and surrounds the semiconductor chip 310 to thereby form a space. The space forms an internal cavity 340 of the package structure 30 upon completion of a packaging process. An optical component 350 is disposed on the spacer 330. The optical component 350 faces the first surface 310A of the semiconductor chip 310 and disposes on the spacer 330. The optical component 350 includes a first patterned encapsulant layer 354. The semiconductor chip can be light-emitting chip, such as the light-emitting diode chip or laser chip. In the embodiment, the semiconductor chip 310 is a laser chip. The optical component 350 includes a micro lens array (MLA) or a diffraction optical element (DOE), whereby a laser beam emitted from the semiconductor chip 310 is converted into a uniform surface light source, array dots light source or irregularly scattered dots light source. By the first conducting structure 312 and the second conducting structure 314, the semiconductor chip 310 in the internal cavity 340 of the package structure 30 is electrically connected to an external circuit board 32, and the spacer 330 is connected to the optical component 350 and the glue layer 320 by adhesive layers 360, 362, respectively. In this embodiment, the adhesive layers 360, 362 includes non-conductive adhesive material and can connect the spacer 330 to the optical component 350 and connect the spacer 330 to the underlying glue layer 320. In this embodiment, when a current from the external circuit board 32 passes through the first conducting structure 312 and the second conducting structure 314 to drive the semiconductor chip 310, the semiconductor chip 310 emits a laser beam which passes through the optical component 350. The optical component 350 includes a conducting layer having a transparent conductive material, such as indium tin oxide (ITO), to not only prevent blocking the laser beam emitted from the semiconductor chip 310, but also to detect the condition of the optical component 350. When the optical component 350 is functioning well, the conducting layer allows passage of the current. The external circuit board 32 has a feedback circuit (not shown) electrically connected to the semiconductor chip 310. The conducting layer of the optical component 350 and the feedback circuit on the external circuit board 32 are electrically connected by a connection structure 370. In an embodiment, the feedback circuit includes a resistance sensor and a circuit breaker. When the optical component 350 is damaged, the conducting layer of the optical component 350 may also be damaged, thereby leading to a resistance change or an open circuit. As a result, the resistance sensor of the feedback circuit electrically connected to the conducting layer instantly detects the resistance change of the conducting layer in the optical component 350, and the circuit breaker of the feedback circuit electrically connected to the conducting circuit layer turns off the semiconductor chip 310 to prevent the semiconductor chip 310 from emitting the laser beam.

Referring to FIG. 4A through FIG. 4F, there are schematic cross-sectional views of a process flow of manufacturing the package structure 30 shown according to an embodiment of the present disclosure.

Figure 4A:
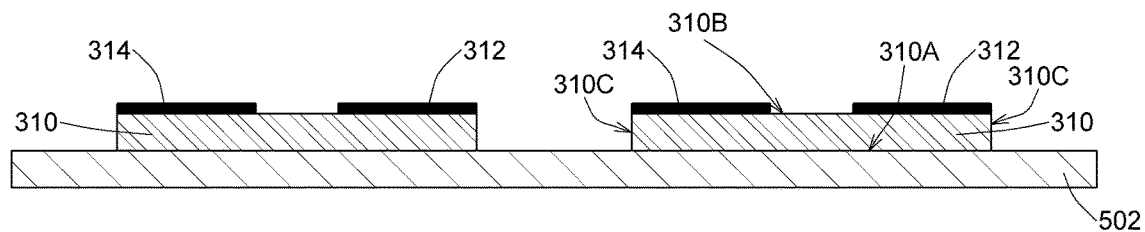
FIG. 4A through FIG. 4F are schematic cross-sectional views of a process flow of manufacturing the package structure according to an embodiment of the present disclosure.

In this embodiment, the chip scale package structure of the VCSEL component is manufactured by a wafer level package manufacturing process. First, as shown in FIG. 4A, the semiconductor chips 310 are arranged on a tape 502, and the semiconductor chips 310 respectively include the first conducting structure 312 and the second conducting structure 314. Then, as shown in FIG. 4B, transfer the semiconductor chips 310, and place the semiconductor chips 310 upside down on a glass sheet 506 covered with a glue layer 504, and remove the tape 502 to expose the first surfaces 310A of the semiconductor chips 310.

Figure 4B:
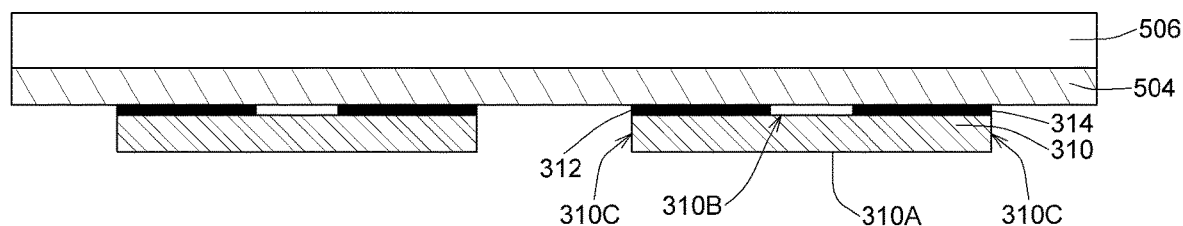
Figure 4C:
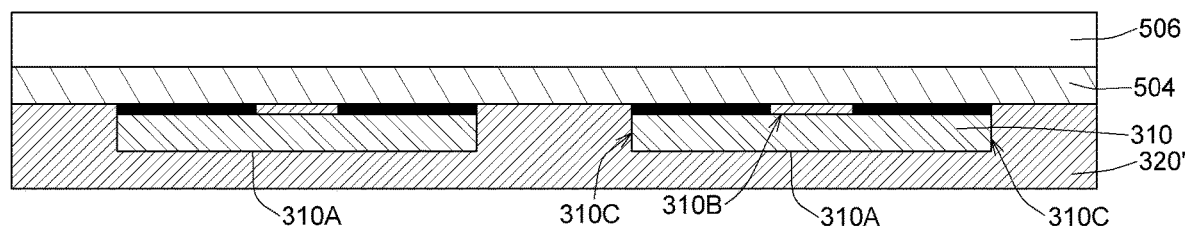

After that, an encapsulant 320' fills the structure shown in FIG. 4B by glue brushing, for example, such that the encapsulant 320' encloses each semiconductor chip 310, as shown in FIG. 4C. Next, a part of the encapsulant 320' covering the first surface 310A of the semiconductor chip 310 is removed by polishing and/or sandblasting, for example, to form the structure shown in FIG. 4D. The partial removal of the encapsulant 320' brings the formation of the glue layer 320 which surrounds the side surface 310C of the semiconductor chip 310. The glue layer 320 is coplanar with the first surfaces 310A of the semiconductor chips 310.

Figure 4D:
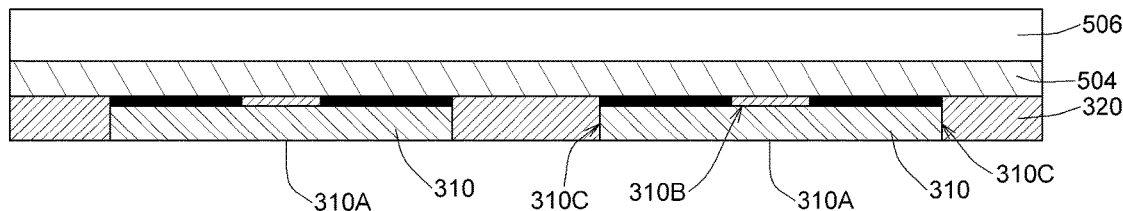
Figure 4E:
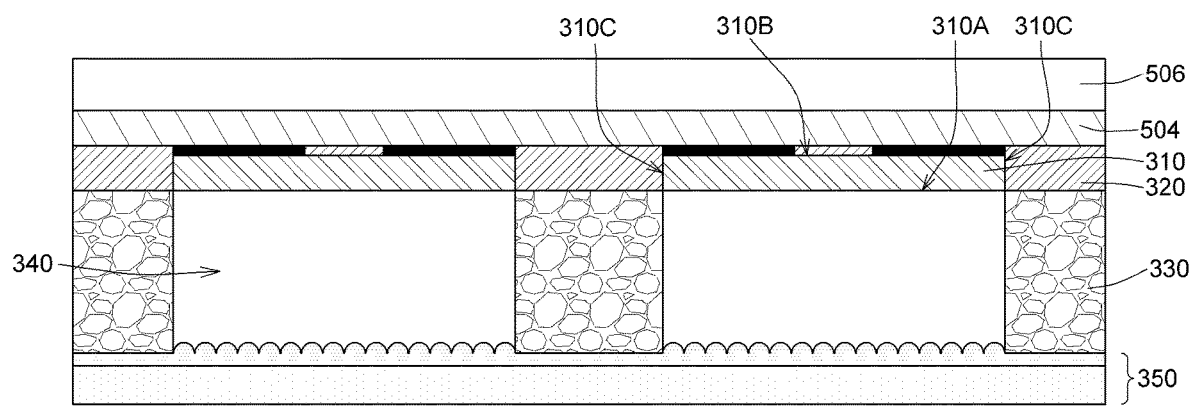

Then, the spacer 330 and the optical component 350 are connected to the structure shown in FIG. 4D by wafer bonding to form the structure shown in FIG. 4E. In this embodiment, the spacer 330 connects to the glue layer 320 and surrounds the semiconductor chip 310 to thereby form the air layer or the internal cavity 340 of the package structure.

Figure 4F:
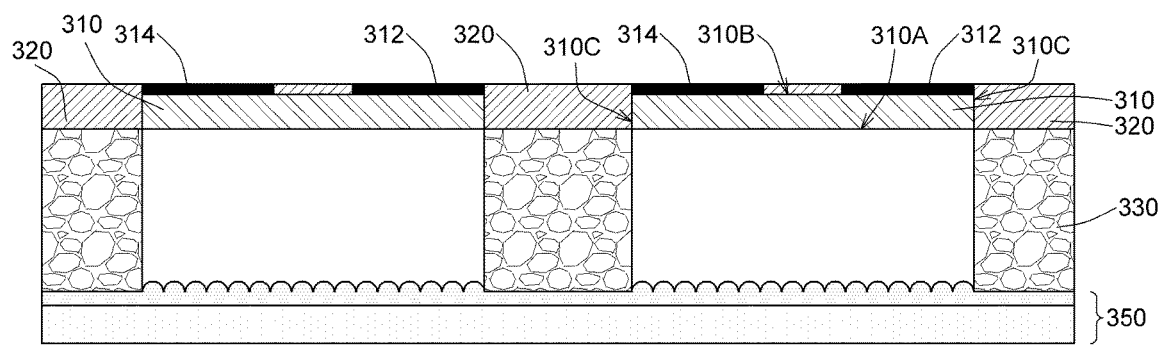

Next, the glue layer 504 and the glass sheet 506 are removed to form the structure shown in FIG. 4F.

After that, the structure shown in FIG. 4F is cut into several individual structures to form the package structure 30. The optical component 350 of the package structure 30 is electrically connected to the external circuit board 32 by the connection structures 370 as shown in FIG. 3.

Alternatively, gaps between the semiconductor chips 310 shown in FIG. 4B are filled with an encapsulant by plate-aided glue brushing to form the glue layer 320 of the structure shown in FIG. 4D. A plate is adapted to shield the semiconductor chip 310 and thereby prevents the encapsulant from contacting with the first surface 310A of the semiconductor chip 310.

Figure 5A:
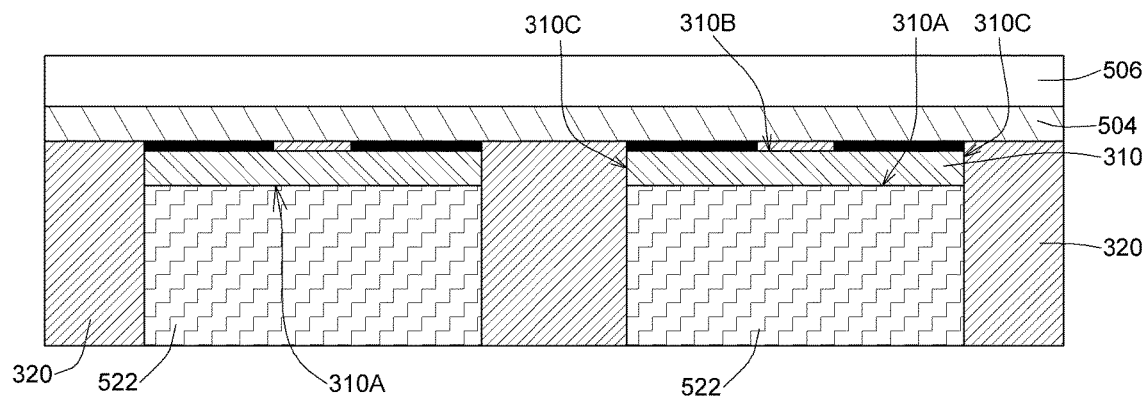
FIG. 5A through FIG. 5C are schematic cross-sectional views of a process flow of manufacturing the package structure according to an embodiment of the present disclosure.
Figure 5B:
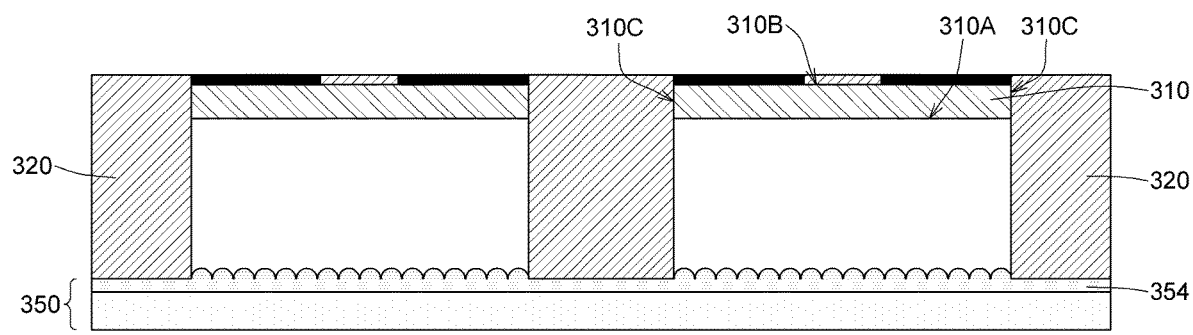
Figure 5C:
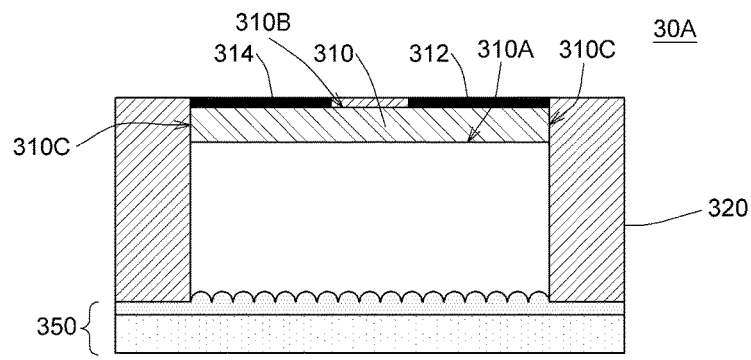

FIGS. 5A-5C show structures and manufacturing process in another embodiment. As shown in FIG. 5A, after a protective layer 522 (such as dry-film protective layer) has been disposed on the first surfaces 310A of the semiconductor chips 310, parts of the protective layer 522 are removed by photolithography to form vacancies, allowing the encapsulant to fill into the vacancies and form the glue layers 320. Then, a polishing process is performed on the protective layer 522 to remove the encapsulant which overflows. After that, the protective layer 522 is removed. Next, the optical component 350 and the glue layer 320 are connected by aligned bonding process. Then, the glue layer 504 and the glass sheet 506 are removed to form the structure shown in FIG. 5B. Then, a cutting process is carried out to cut the structure shown in FIG. 5B into individual structures, so as to form the package structure 30A of the present disclosure, as shown in FIG. 5C.

Figure 6A:
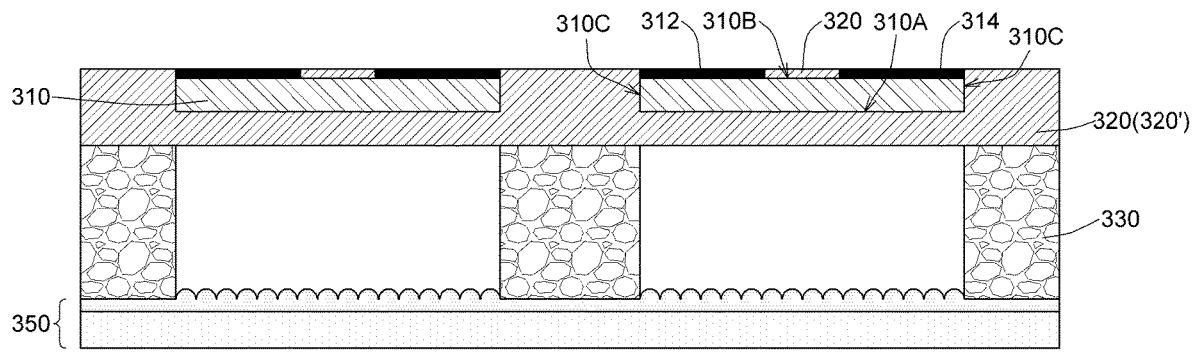
FIG. 6A and FIG. 6B are schematic cross-sectional views of a process flow of manufacturing the package structure according to an embodiment of the present disclosure.
Figure 6B:
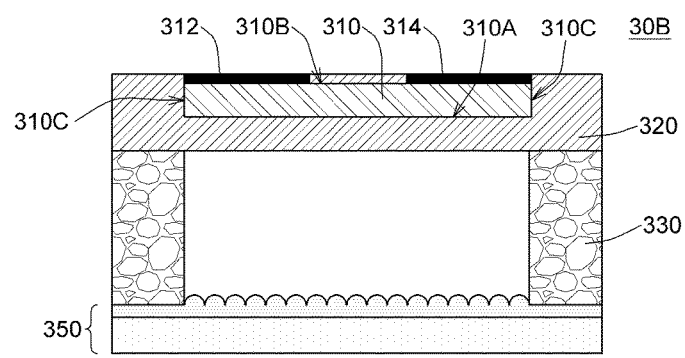

FIGS. 6A-6B show structures and manufacturing process in another embodiment. In this embodiment, the encapsulant 320' (shown in FIG. 4C) on the first surface 310A of the semiconductor chip 310 is retained, rather than polished or removed, to function as the glue layer 320. Then, the spacer 330 connects to the optical component 350 and the glue layer 320, and then the glue layer 504 and the glass sheet 506 are removed to form the structure shown in FIG. 6A. Next, the structure shown in FIG. 6A is cut to form a package structure 30B of the present disclosure shown in FIG. 6B.

Figure 7A:
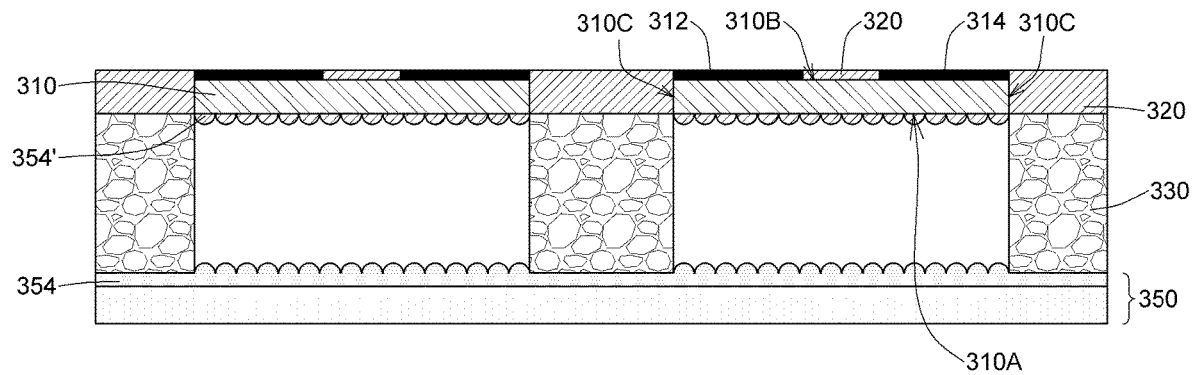
FIG. 7A and FIG. 7B are schematic cross-sectional views of a process flow of manufacturing the package structure according to an embodiment of the present disclosure.
Figure 7B:
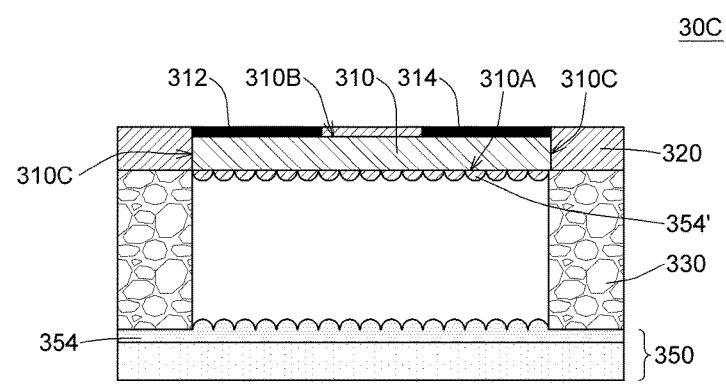

In another embodiment illustrated by FIGS. 7A-7B, the encapsulant 320' on the first surface 310A of the semiconductor chip 310, which is formed in a preceding embodiment illustrated by FIG. 4C, undergoes patterning to form a second patterned encapsulant layer 354', such as a micro lens array (MLA) or a diffraction optical component (DOE), which has an optical effect different from that of the first patterned encapsulant layer 354 in the optical component 350. For example, second patterned encapsulant layer 354' is able to convert a laser beam emitted from the semiconductor chip 310 into a uniform surface light source, array dots light source or irregularly scattered dots light source, as shown in FIG. 7A. Then, the structure shown in FIG. 7A is cut to form a package structure 30C of the present disclosure, as shown in FIG. 7B.

Figure 8:
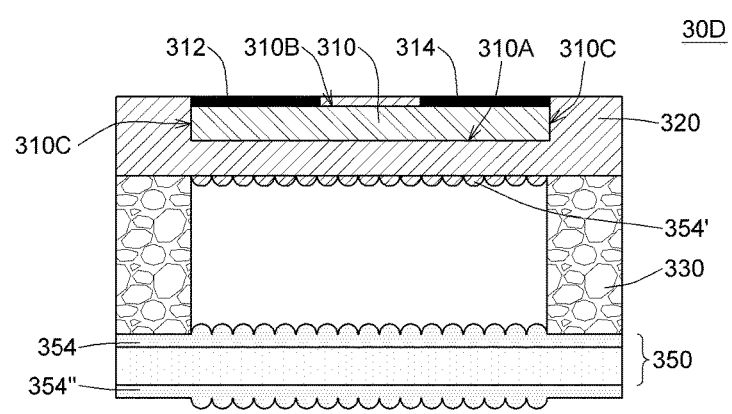
FIG. 8 is a schematic cross-sectional view of the package structure according to an embodiment of the present disclosure.

In another embodiment of the package structure 30D of the present disclosure illustrated by FIG. 8, a third patterned encapsulant layer 354" is formed on the outer surface of the optical component 350, which the first patterned encapsulant layer 354 is not formed thereon. The third patterned encapsulant layer 354" has an optical effect different from that of the second patterned encapsulant layer 354' on the first surface 310A of the semiconductor chip 310 and/or different from that of the first patterned encapsulant layer 354 on the optical component 350. For example, the second patterned encapsulant layer 354" is able to convert a laser beam emitted from the semiconductor chip 310 into a uniform surface light source, array dots light source or irregularly scattered dots light source. More specifically, in the embodiment, the first patterned encapsulant layer 354 is formed on the inner surface of the optical component 350, and the inner surface is opposite to the outer surface of the optical component 350.

Figure 9A:
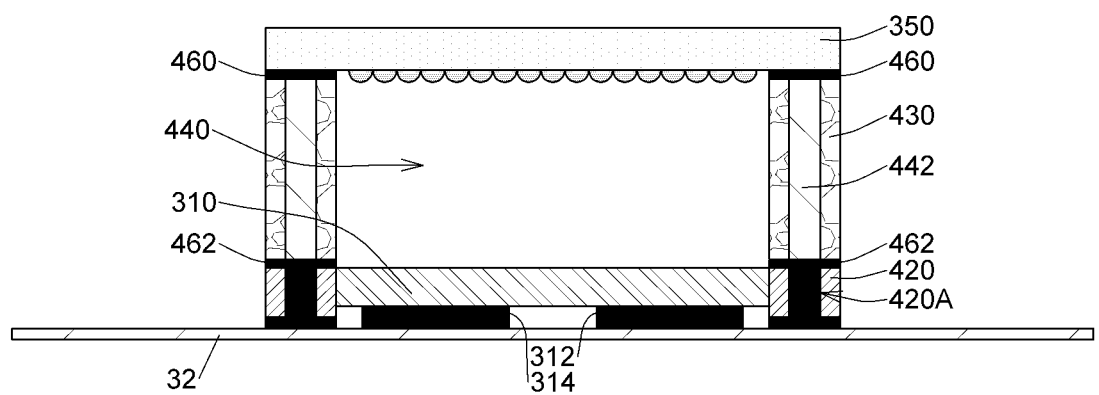
FIG. 9A and FIG. 9B are schematic cross-sectional views of package structures according to an embodiment and a variant embodiment of the present disclosure, respectively.
Figure 9B:
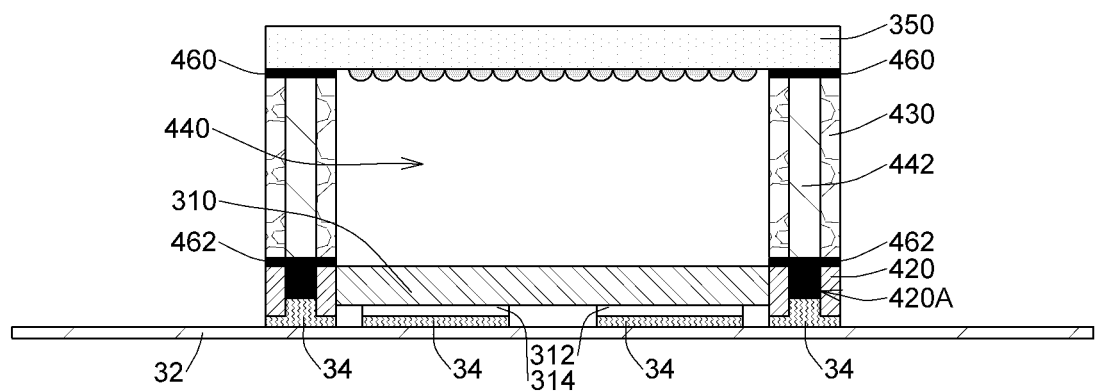
Figure 10A:
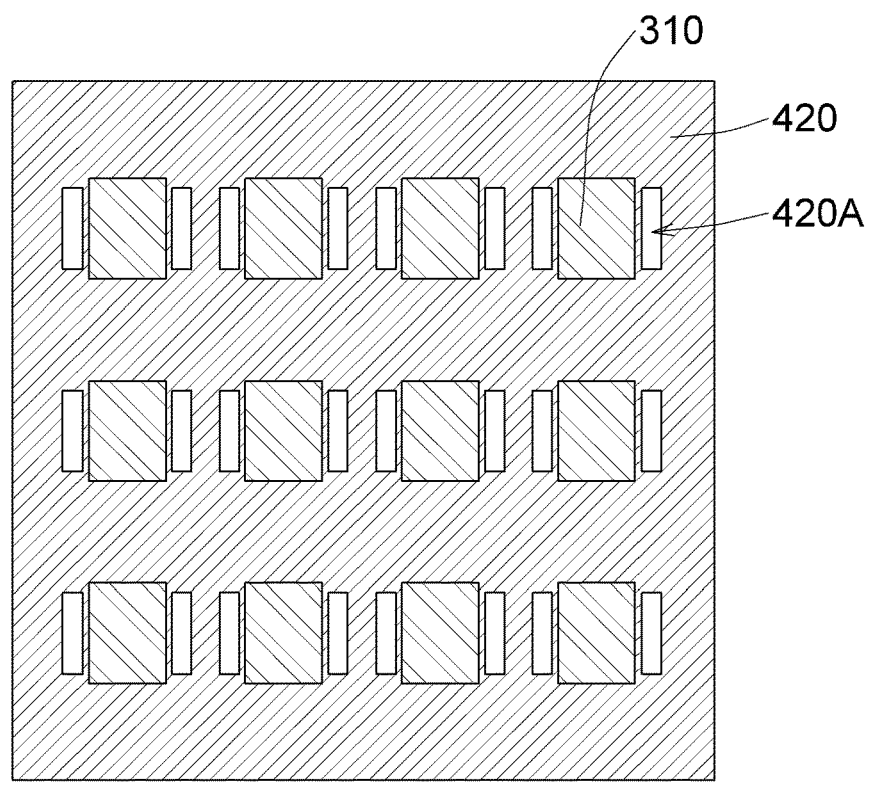
FIG. 10A and FIG. 10B are a top view and a schematic cross-sectional view of a penetration portion of a glue layer according to an embodiment of the present disclosure, respectively.
Figure 10B:
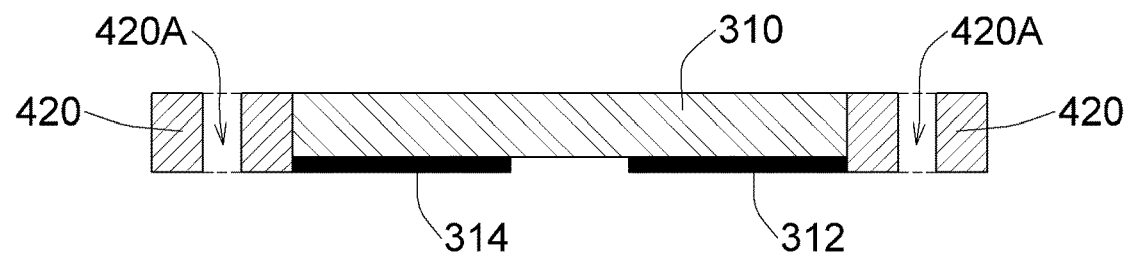

As shown in FIGS. 9A, 9B, in another embodiment of the present disclosure, the spacer in the package structure can include an electrical conducting member, which penetrates the spacer, for electrical conduction. Referring to FIG. 9A and FIG. 9B, there are schematic cross-sectional views of package structures 40A, 40B shown according to an embodiment and a variant embodiment of the present disclosure, respectively. The package structures 40A, 40B are manufactured by identical or similar manufacturing processes and are structurally similar to the package structure 30. The differences between the package structures 40A, 40B and the package structure 30 are as follows: in the embodiments, the spacer 430, which surrounds the semiconductor chip 310 and thus forming an internal cavity 440, includes an electrical conducting member 442 penetrates a spacer 430. A first electrical conducting layer 460 connects the conducting layer of the optical component 350 and the electrical conducting member 442. A glue layer 420 includes a penetration portion 420A aligned to the electrical conducting member 442. The penetration portion 420A is filled with electrical conducting glue to form a second electrical conducting layer 462 connected to the electrical conducting member 442. In the embodiment, the electrical conducting member 442 and the electrical conducting layers 460, 462 can be electrical conducting glue, such as silver paste, solder paste and self-assembly anisotropic conductive paste (SAP), or metal suitable for electroplating, such as gold, silver, copper and an alloy thereof. In this embodiment, the first and second conducting structures 312, 314 of the semiconductor chip 310 respectively function as a positive terminal and a negative terminal. Besides, the second electrical conducting layer 462 of the package structure respectively function as a positive terminal and a negative terminal, and the first and second conducting structures 312, 314 and the second electrical conductive layer 462 thus are directly connected to the external circuit board 32 to form the package structure 40A shown in FIG. 9A. Alternatively, the first and second conducting structures 312, 314 and the second electrical conductive layer 462 are connected to the external circuit board 32 by solder pastes 34 to form the package structure 40B shown in FIG. 9B. Therefore, in this embodiment, the optical component 350 of the package structures 40A, 40B is electrically connected to the external circuit board 32 by the first electrical conducting layer 460, the electrical conducting member 442 and the second electrical conducting layer 462. In the embodiments shown in FIGS. 9A, 9B, the glue layer 420 has therein the penetration portion 420A aligning to the electrical conducting member 442 in the spacer 430 and corresponding to the electrodes of the optical component 350, such as the first conducting portion 358A and the second conducting portion 358B shown in FIG. 11. The penetration portion 420A in the glue layer 420 can be formed by applying the encapsulant by plate-aided glue brushing. More specifically, when applying the encapsulant, shielding the chip 310 and the location which is predetermined to form the penetration portion 420A by the plate, so as to prevent the encapsulant from covering the chip. Therefore, the penetration portion 420A in the glue layer 420 is formed, as shown in FIG. 10A (top view) and FIG. 10B (cross-sectional view). The penetration portion 420A is filled with a conductive adhesive material to form the second electrical conducting layer 462, and then the resultant structure is connected to the optical component 350 by the spacer 430 having the electrical conducting member 442. Therefore, the package structures 40A, 40B shown in FIGS. 9A, 9B are formed. In this embodiment, the optical component 350 of the package structures 40A, 40B is electrically connected to the external circuit board 32 by the electrical conducting member 442. Therefore, there is no need to set the connection structure connected to an external circuit board.

According to the present disclosure, the encapsulant and/or conductive adhesive material can be applied by plate-aided glue brushing to form a glue layer 420 and the electric conducting layers 460,462 of the package structure, respectively, so as to exercise stable control over the required amount of glue, increase the production yield (such as units per hour, UPH) of the manufacturing process, and reduce the cost of the manufacturing process. Furthermore, the glue brushing process entails applying a specific level of pressure, and thus sufficient room can be preserved around the periphery of the semiconductor chip 310 to accommodate conductive adhesive material (such as solder paste). During a surface mounting technology (SMT) process, the second electrical conducting layer 462 (as shown in FIG. 9A) or solder paste 34 (as shown in FIG. 9B) connects to electrical terminals (not shown) of the external circuit board 32 to thereby form an electrical connection.

Figure 11A:
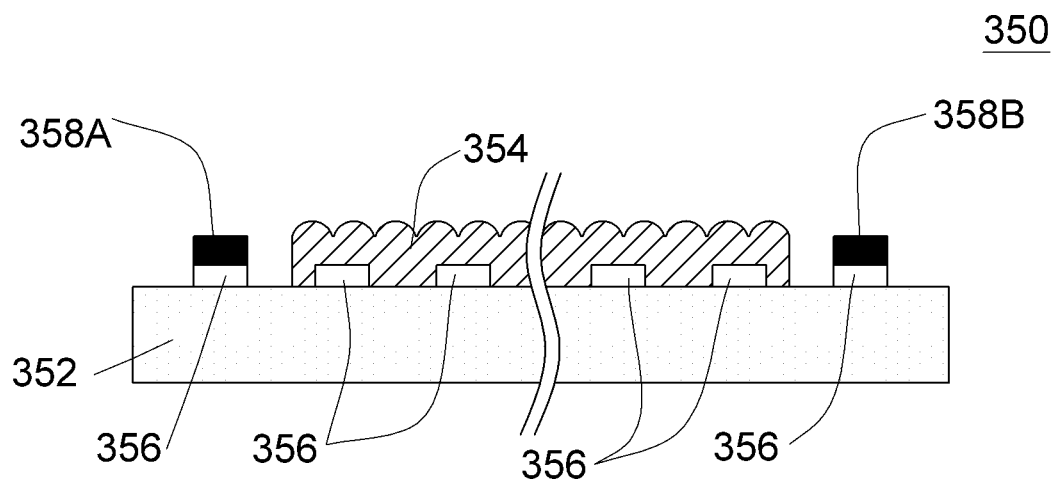
FIG. 11A through FIG. 11G are a cross-sectional view and top views of an optical component according to an embodiment of the present disclosure, respectively.
Figure 11B:
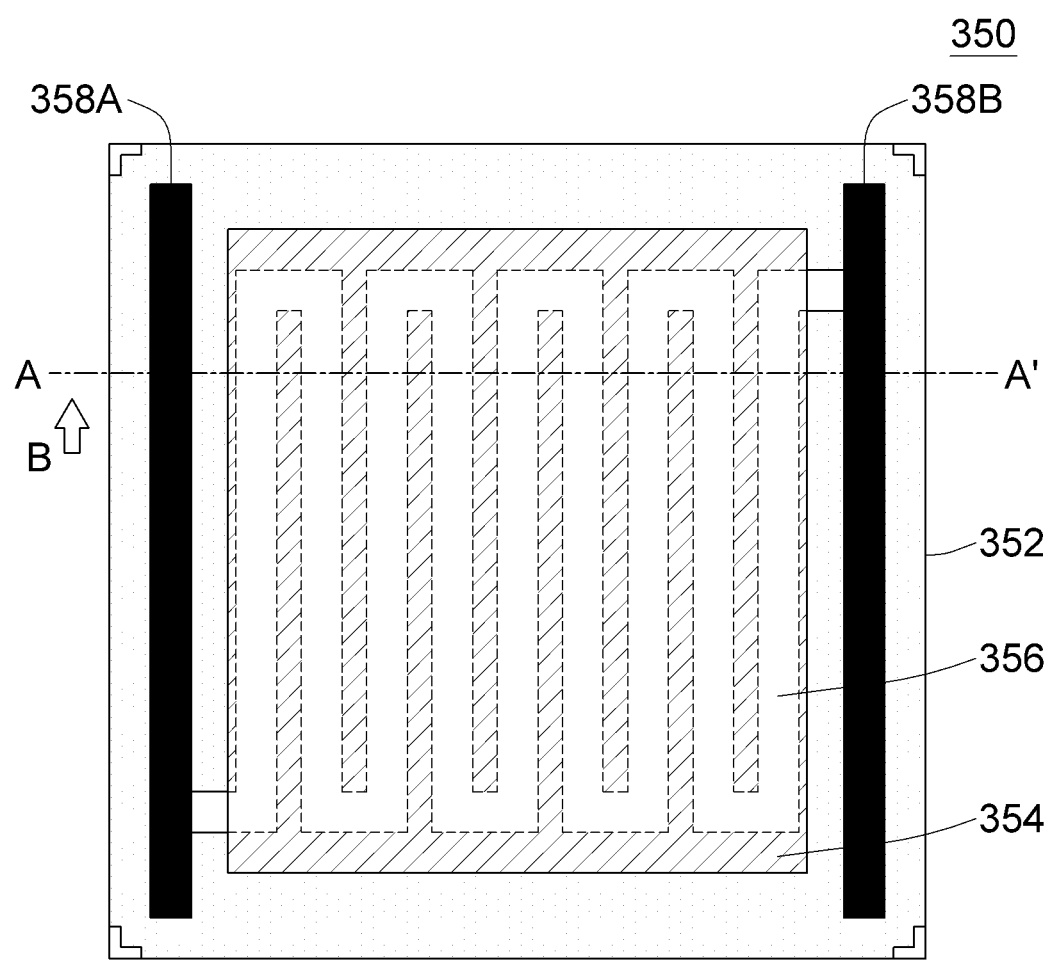

FIG. 11A and FIG. 11B respectively show a cross-sectional view and a top view of the optical component 350 according to an embodiment of the present disclosure. FIG. 11A schematically depicts a cross-sectional structure taken along line A-A' of FIG. 11B and viewed in the direction of arrow B of FIG. 11B. In this embodiment, the optical component 350 includes a glass layer 352, the first patterned encapsulant layer 354 on the glass layer 352 and facing the semiconductor chip (not shown), and a conducting layer 356 between the glass layer 352 and the first patterned encapsulant layer 354. Referring to FIG. 11B, the conducting layer 356 further connects to a first conducting portion 358A and a second conducting portion 358B, which are disposed at the opposing edges of the peripheral area of the glass layer 352. Although the first conducting portion 358A and second conducting portion 358B are spatially discrete, they are electrically connected to each other by the conducting layer 356.

Figure 11C:
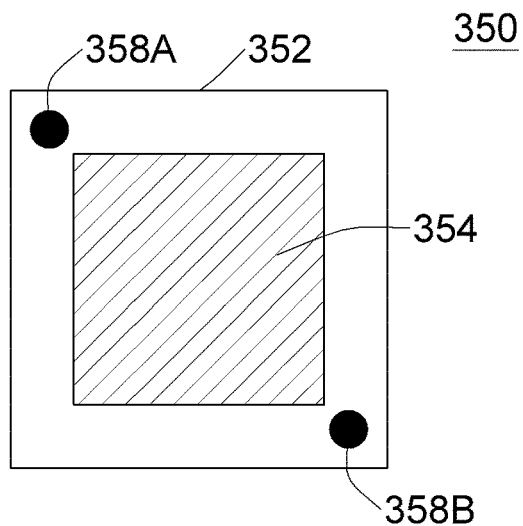
Figure 11D:
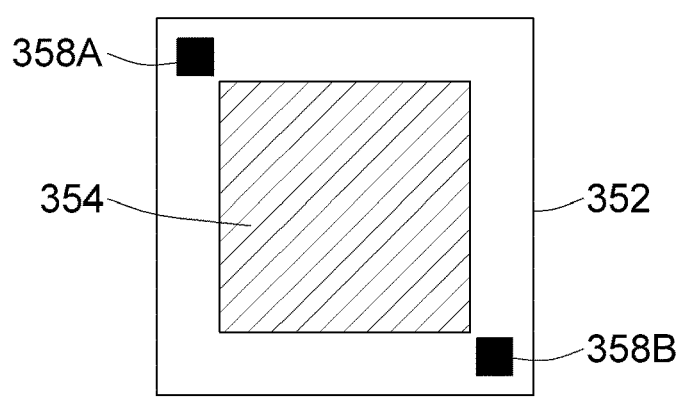
Figure 11E:
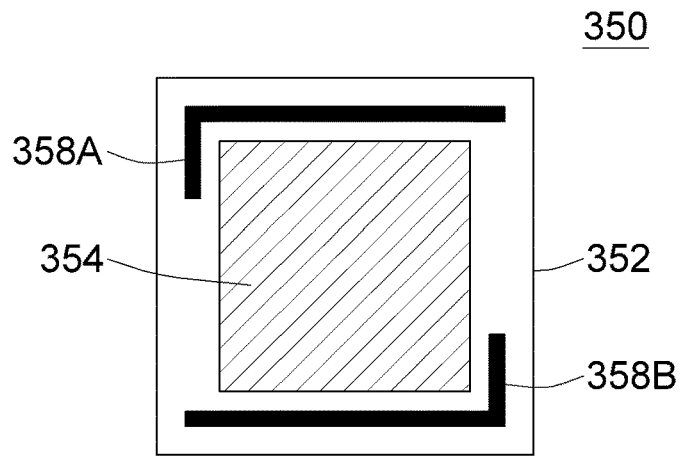
Figure 11F:
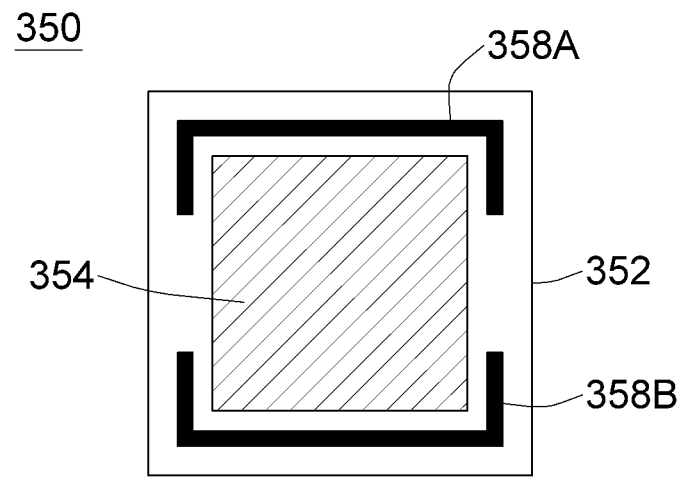
Figure 11G:
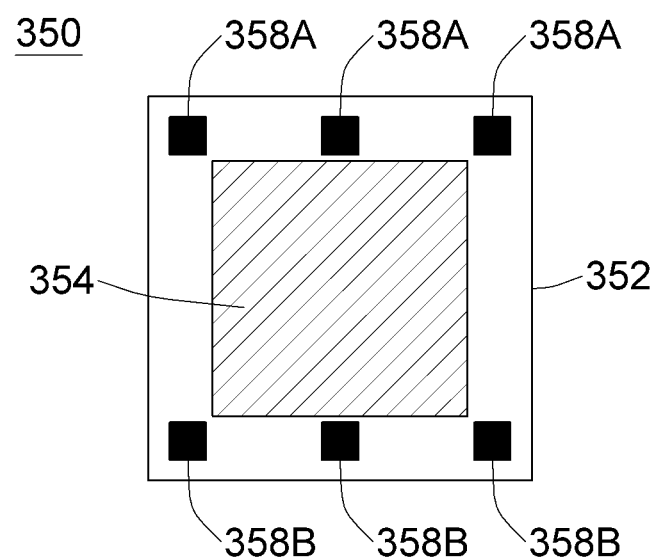

In an embodiment, the first conducting portion 358A and second conducting portion 358B are conductive material, for example, copper, silver, gold, and tin, and they can be formed by electroplating process or coating process. Furthermore, as shown in FIG. 11B, the shapes of the first conducting portion 358A and second conducting portion 358B are selectively linear (as shown in FIG. 11B), circular (as shown in FIG. 11C), square (as shown in FIG. 11D), L-shaped (as shown in FIG. 11E), U-shaped (as shown in FIG. 11F), or a combination thereof. The number of the first conducting portion 358A and the number of the second conducting portion 358B are not limited to one. In other embodiment, a plurality of first conducting portions 358A and a plurality of second conducting portions 358B are respectively disposed on opposing edges of the glass layer 352 (as shown in FIG. 11G).

According to the present disclosure, the optical component 350 includes but is not limited to a micro lens array (MLA), indium tin oxide (ITO) glass having a conducting layer, and a diffraction optical element (DOE). In an embodiment, the optical component 350 is a combinative optical component, as the first patterned encapsulant layer 354 includes different patterns, so as to form different lens structures, such as a micro lens array (MLA) and a diffraction optical element (DOE), and convert the laser beam into different light forms, such as a surface light source, array dots light source and irregularly scattered dots light source.

In the aforesaid embodiment, the semiconductor chip 310 is a flip chip. The glue layers 320, 420 and the encapsulant 320' can be transparent glue or opaque glue, such as epoxy or silicon. The spacers 330, 430 can be glass, ceramic, or plastic which is suitable for 3D printing or molding.

Figure 12:
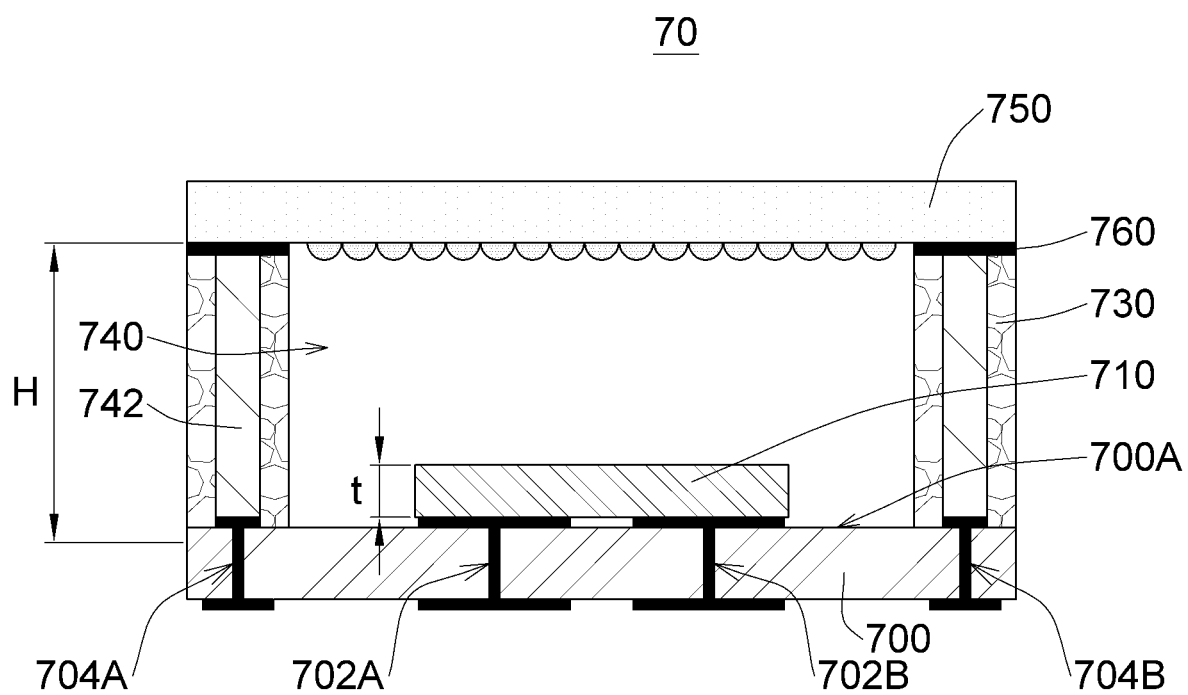
FIG. 12 is a schematic cross-sectional view of the package structure according to an embodiment of the present disclosure.

FIG. 12 shows a schematic cross-sectional view of the package structure according to an embodiment of the present disclosure. In this embodiment, a package structure 70 includes a substrate 700 and a semiconductor chip 710 on a first surface 700A of the substrate 700. The substrate 700 is a ceramic substrate. The substrate 700 includes first electrical conducting posts 702A, 702B and second electrical conducting posts 704A, 704B penetrate the substrate 700. The first electrical conducting posts 702A, 702B electrically connect to the semiconductor chip 710 and function as positive and negative terminals, respectively, to thereby enable the semiconductor chip 710 to be electrically connected to the external circuit board (not shown). The package structure 70 includes support 730. The support 730 is disposed on the first surface 700A and surrounds the semiconductor chip 710. The support 730 includes a height H greater than a thickness t of the semiconductor chip 710, thereby provides an internal cavity 740. The internal cavity 740 functions as a gas layer (the gas layer is either filled with an inert gas, air or evacuated) of the package structure 70. The package structure 70 includes an optical component 750. The optical component 750 is connected to the support 730 by a conducting structure 760 formed by the conductive glue applied to the supports 730. In this embodiment, the optical component 750 is an ITO optical component having a conducting layer.

According to the present disclosure, the support 730 are formed, for example, by plastic injection, molding or 3D printing, and includes electrical conducting member 742 vertically penetrated the support 730, such that the optical component 750 electrically connects to the second electrical conducting posts 704A, 704B by the electrical conducting member 742. The conductive glue for the conducting structure 760 is, for example, silver paste, solder paste, self-assembly anisotropic conductive paste (SAP) or any other electrical conducting material.

According to the present disclosure, the support 730 is formed by plastic injection, molding or 3D printing, and covers the electrical conducting member 742, and adheres to the optical component 750 by the conductive glue, such as silver paste, solder paste or self-assembly anisotropic conductive paste (SAP). The optical component 750 is electrically connected to the second electrical conducting posts 704A, 704B of the substrate 700 by the conducting structure 760 and the electrical conducting member 742 in the support 730. Alternatively, the support 730 can be formed by laser direct structuring (LDS), and then metal-plated layers are formed by electroplating or electroless plating, so as to form the conducting structure 760, thereby allowing the optical component 750 to be electrically connected to the substrate 700.

According to the present disclosure, the conducting structure 760 on the support 730 is selectively linear, circular, square, L-shaped, U-shaped, or a combination thereof. Furthermore, the number of the conducting structure 760 on one single edge of the support 730 is not limited to one. In other embodiment, a plurality of conducting structures 760 are disposed on opposing edges of the support 730. The top-view shapes of the conducting structure 760 can be similar to that of the first conducting portion 358A and second conducting portion 358B depicted by the schematic top views of FIG. 11B through FIG. 11G.

The optical component 750 has the same structural features as the optical component 350 shown in FIG. 11A and thus is, for the sake of brevity, not described hereunder.

Referring to FIG. 13A through FIG. 13C, and FIG. 14A through FIG. 14D, there are cross-sectional views and top views of the package structure shown according to respective embodiments of the present disclosure. FIGS. 13A-13C and FIGS. 14A-14D only show the support 730 and the optical component 750, and the other components are omitted.

Figure 13A:
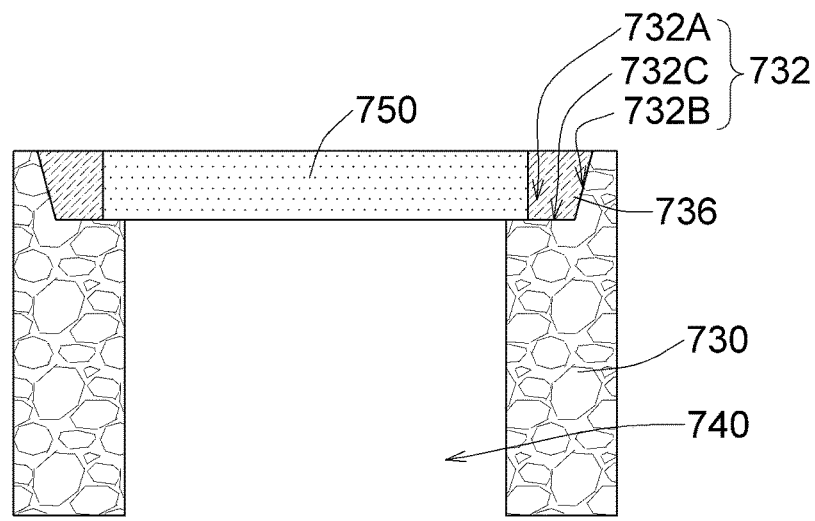
FIG. 13A through FIG. 13C are cross-sectional views of supports taken along line A-A' of FIG. 14A.
Figure 13B:
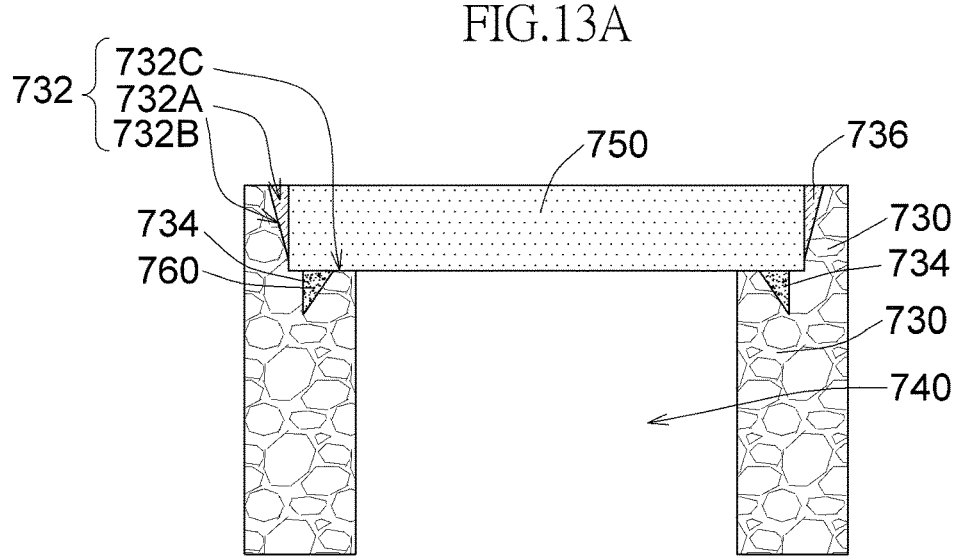
Figure 14A:
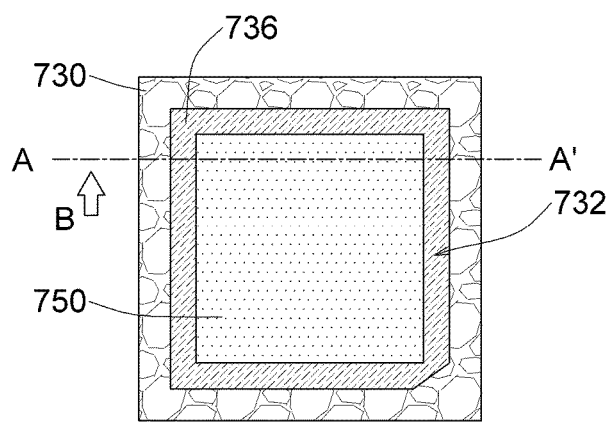
FIG. 14A through FIG. 14D are top views of the supports according to the embodiments of the present disclosure.

FIG. 13A and FIG. 13B shows cross-sectional views of package structure taken along line A-A' and viewed in the direction of arrow B of FIG. 14A according to an embodiment of the present disclosure. Referring to FIG. 13A, according to the present disclosure, the support 730 includes four sidewalls surrounding the semiconductor chip, and each of the sidewalls includes aforesaid electrical conducting member (not shown).

Referring to FIG. 13A, support 730 includes a positioning portion 732 on top side, which is opposite to the side connected to the substrate 700 (as shown in FIG. 12), and the positioning portion 732 receives and holds the optical component 750. In this embodiment, the positioning portion 732 is a recess includes a bottom 732C and a sidewall 732B. The bottom 732C underpins the optical component 750. The sidewall 732B connects to the bottom 732C. The width of the positioning portion 732 is slightly larger than the width of the optical component 750 from the cross-sectional view of the package structure. A gap 732A is defined between the sidewall 732B and the optical component 750 and filled with a sealing glue layer 736. The sidewall 732B can be an oblique surface to facilitate filling the positioning portion 732 with the sealing glue layer 736, so as to hermetically seal the internal cavity 740 of the package structure.

In an embodiment shown in FIG. 13B, in addition to the positioning portion 732, the support 730 further includes a channel 734 on the top side. The channel 734 extends from the bottom 732C to the underside of the support 730 and is filled with conductive glue, such as silver paste, solder paste, and self-assembly anisotropic conductive paste (SAP). The optical component 750 is electrically connected to an electrical conducting member (not shown) in the support 730 by the conducting structure 760. Referring to FIG. 13B, after the optical component 750 has been placed on the bottom 732C of the positioning portion 732, the gap 732A between the optical component 750 and the sidewall 732B of the positioning portion 732 is spaced apart from the channel 734 filled with conductive glue. In other words, the gap 732A and the channel 734 are not in communication with each other after placing the optical component 750. In the embodiment, the gap 732A is filled with glue, for example, filled with transparent glue as needed, such that the sealing glue layer 736 is formed between the optical component 750 and the supports 730, so as to hermetically seal the internal cavity 740 of the package structure.

Figure 13C:
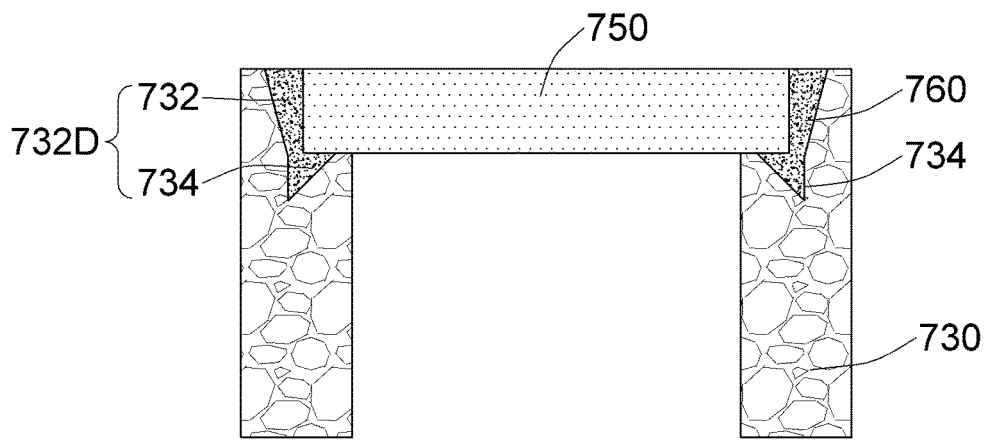

Alternatively, as shown in FIG. 13C, after the optical component 750 has been placed on the bottom 732C of the positioning portion 732, the channel 734 and the positioning portion 732 jointly form a communication space 732D. In this embodiment, the positioning portion 732 and the channel 734 of the support 730 is filled with the same conductive glue (such as silver paste) by only one filling process, so as to form the conducting structure 760.

FIG. 14A shows a top view of the cross-sectional structure shown in FIG. 13A and FIG. 13B. In the support 730 shown in FIG. 13A, the shape of the positioning portion 732 corresponds to that of the optical component 750, and the width of the positioning portion 732 is slightly larger than the width of the optical component 750. The gap 732A is filled with glue, so as to form the sealing glue layer 736. Referring to FIG. 14A, the optical component 750 is positioned in the positioning portion 732 of the support 730. The sealing glue layer 736 surrounds the periphery of the optical component 750 to block moisture and protect the optical component 750. Besides, In the support 730 shown in FIG. 13B, the channel 734 is formed under the positioning portion 732. The channel 734 is filled with conductive glue to form the conducting structure 760. Referring to FIG. 14A, the optical component 750 is positioned in the positioning portion 732 of the support 730, and the underlying conducting structure 760 in the channel 734 is concealed by the optical component 750.

Figure 14B:
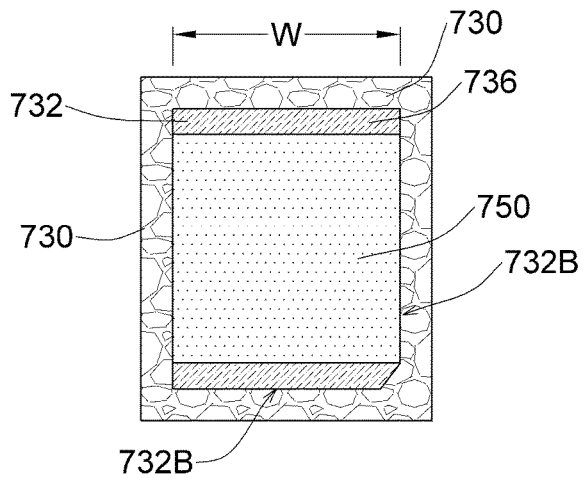
Figure 14C:
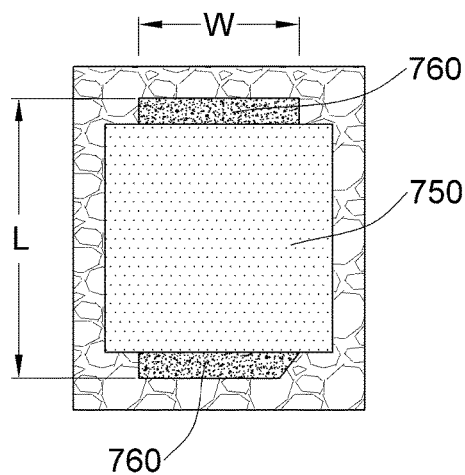
Figure 14D:
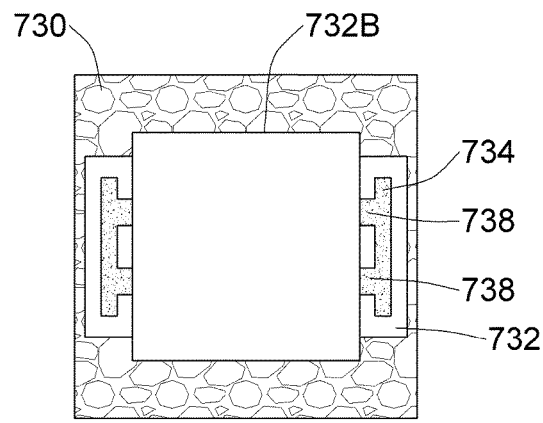

According to the present disclosure, the size and shape of the positioning portion 732 can be adjustable according to the practical application, as shown in the top views of FIG. 14B through FIG. 14D. For instance, a width W of the positioning portion 732 ensures that the two ends of the optical component 750 held by the positioning portions 732 abut against two opposing ones of the supports 730 (shown in FIG. 14B), respectively. The conductive glue fills the channel (not shown) under the optical component 750. The transparent glue fills in the gap 732A between the positioning portion 732 and a portion of the optical component 750 to form the sealing glue layer 736, wherein the portion of the optical component 750 does not adjoin the sidewall 732B of the support 730. Alternatively, as shown in FIG. 14C, the width W of the positioning portion 732 is smaller than the width of the optical component 750, and the length L of the positioning portion 732 is greater than the length of the optical component 750. Therefore, the positioning portion 732 is not concealed by the optical component 750 and filled with the conductive glue to form the conducting structure 760. The other structural features of the support 730 in the embodiment are similar to their counterparts in the aforesaid embodiments and thus are, for the sake of brevity, not described hereunder.

To further facilitate performing the glue brushing process and facilitate forming different forms of the conducting structures of the support, it is feasible for the support to have various channel structure designs. FIG. 14D is a top view of the support 730 before placing the optical component 750. Except to the positioning portion 732 and the channel 734 filled with the conductive glue are disposed on top of the support 730, the support 730 further includes a sub channel 738 formed on two opposing edges of the support 730. The sub channel 738 has a depth less than that of the channel 734. The sub channel 738 connect the channel 734 and a sidewall 732B of the support 730. The sub channel 738 enables the conductive glue to enter the deeper site of the channel 734.

According to the present disclosure, the support can be plastic material which is formed by plastic injection, molding or 3D printing. The support has the electrical conducting member for electrical conduction and is covered by the plastic material. In other embodiment, the support can be metallic support for providing direct electrical connection. The metallic support has an interface of separation to separate the positive terminal and the negative terminal. The metallic support includes metallic electrical conducting member and is capable of directly electrical connecting to an electrical conducting layer (such as the first electrical conducting layer 460 shown in FIGS. 9A and 9B) or metal-plated layer (such as the conducting structure 760 shown in FIG. 13B) deposited on the metallic support.

Therefore, the present disclosure provides a package structure having a protection mechanism and a wafer level package manufacturing process for manufacturing the package structure. Unlike conventional package structures, the package structure of the present disclosure dispenses with a photodiode and external circuit (such as wire 215) which otherwise jointly function as a protection mechanism. In this regard, the package structure of the present disclosure includes the support adapted to support an optical component and having an electrical conducting member covered by the support. The electrical conducting member connects to the optical component with conductive layer. Therefore, the volume of the entire package structure or modules can be greatly reduced, and the risk of modular failure caused by an external circuit break can also be greatly reduced. Furthermore, the wafer-level package manufacturing process is able to reduce the process procedure and manufacturing cost.

In addition to the aforesaid technical features, the present disclosure discloses channel and sub channel of the support to enhance glue brushing quality and efficiency. In particular, according to the present disclosure, the gap between the optical component and the support are completely filled with conductive or non-conductive glue as needed. Therefore, the internal cavity of the package structure is hermetically sealed, so as to prevent moisture from intruding into the optical component and degrading the functionality of the package structure.

Regarding the package structure of the present disclosure, an air layer for separating a semiconductor chip and the optical component is formed from spacers of predetermined height or formed by being filled with an encapsulant of predetermined thickness, so as to render package structure design flexible. Furthermore, predetermined space is filled with conductive glue by plate-aided glue brushing, and the conductive glue (such as solder paste) which overflows the rim of the predetermined space under a pressure during the glue brushing process. Therefore, the electrical terminals connect to a conducting circuit during a subsequent surface soldering process, so as to reduce the complexity of the manufacturing process.

Although the present disclosure is disclosed above by embodiments, the embodiments are not restrictive of the present disclosure. Changes and modifications made by persons skilled in the art to the embodiments without departing from the spirit and scope of the present disclosure must be deemed falling within the scope of the present disclosure. Identical or similar components disclosed in different embodiments, or components disclosed in different embodiments but denoted by identical reference numerals, have identical physical or chemical properties. Under appropriate conditions, the aforesaid embodiments of the present disclosure can be combined or replaced. Connective relationship between a specific element and any other element described in an embodiment may apply to the other embodiments and fall within the scope of the appended claims of the present disclosure.

What is claimed is:

1. A package structure comprising:
    a substrate comprising a first surface;
    a semiconductor chip disposed on the first surface;
    a glue layer disposed on the first surface and directly connecting the side surface of the semiconductor chip, wherein the glue layer comprises at least one electrical conducting layer through into the glue layer and electrically connected to the substrate,
    a support disposed on the glue layer, wherein the support comprises an electrical conducting member penetrating the support electrically connected to the electrical conducting layer of the glue layer; and
    an optical component disposed on the support and electrically connected to the substrate by the electrical conducting member and the electrical conducting layer.

2. The package structure of claim 1, further comprising a sealing glue layer between the optical component and the support.

3. The package structure of claim 1, wherein the substrate comprises a first electrical conducting post and a second electrical conducting post, and the first electrical conducting post electrically connects to the semiconductor chip, and the second electrical conducting post electrically connects to the electrical conducting member.

4. The package structure of claim 1, wherein the optical component comprises a glass layer, on the glass layer, a patterned encapsulant layer disposed on the glass layer and covering a portion of the conducting layer, and a conducting portion disposed on the opposite ends of the perimeter region of the glass layer and covering the conducting layer.

5. A package structure comprising:
    a substrate comprising a first surface;
    a semiconductor chip disposed on the first surface;
    a support disposed on the first surface and surrounding the semiconductor chip, wherein the support comprises an electrical conducting member penetrating the support; and
    an optical component disposed on the support and electrically connected to the substrate by the electrical conducting member;
    wherein the optical component comprises a glass layer, a conducting layer disposed on the glass layer, and a patterned encapsulant layer disposed on the glass layer and covering a portion of the conducting layer;
    wherein the conducting layer comprises a first conducting portion and a second conducting portion which are not electrically connected but are respectively disposed on two opposing edges of the peripheral area from the top view of the package structure.

6. The package structure of claim 5, wherein the shapes of first conducting circuit portion and the second conducting circuit portion are linear, circular, square, L-shaped, U-shaped, or a combination thereof from the top view of the package structure.

7. A package structure comprising:
    a semiconductor chip comprising a first surface, a second surface opposing to the first surface, a side surface between the first surface and the second surface, a first conducting structure and a second conducting structure, wherein the first conducting structure and the second conducting structure are located on the first surface of the semiconductor chip;
    a glue layer surrounding and directly connecting the side surface of the semiconductor chip;
    a spacer disposed on the glue layer and surrounding the semiconductor chip; and
    an optical component disposed on the spacer,
    wherein the optical component comprises a glass layer, a conducting layer disposed on the glass layer, and a patterned encapsulant layer disposed on the glass layer and covering a portion of the conducting layer, wherein at least part of the conducting layer disposed in the central area of the glass layer.

* * * * *